United States Patent
Shim

(10) Patent No.: US 7,482,241 B2
(45) Date of Patent: Jan. 27, 2009

(54) METHOD FOR FABRICATING METAL-INSULATOR-METAL CAPACITOR OF SEMICONDUCTOR DEVICE WITH REDUCED PATTERNING STEPS

(75) Inventor: Sang Chul Shim, Bucheon (KR)

(73) Assignee: Dongbu Electronics, Co., Ltd, Seoul (KR)

( * ) Notice: Subject to any disclaimer, the term of this patent is extended or adjusted under 35 U.S.C. 154(b) by 126 days.

(21) Appl. No.: 11/296,511

(22) Filed: Dec. 8, 2005

(65) Prior Publication Data

US 2006/0141705 A1    Jun. 29, 2006

(30) Foreign Application Priority Data

Dec. 27, 2004    (KR)    ............... 10-2004-0113158

(51) Int. Cl.
*H01L 21/20* (2006.01)
(52) U.S. Cl. .......................................... 438/396
(58) Field of Classification Search ................. 438/397, 438/622, 396
See application file for complete search history.

(56) References Cited

U.S. PATENT DOCUMENTS

| | | | |
|---|---|---|---|
| 6,924,207 B2* | 8/2005 | Son et al. ............ | 438/396 |
| 2003/0057558 A1* | 3/2003 | Akiyama ............. | 257/758 |
| 2005/0158990 A1* | 7/2005 | Park et al. ............ | 438/648 |
| 2005/0263848 A1* | 12/2005 | Cho .................. | 257/532 |
| 2006/0134880 A1* | 6/2006 | Lee .................. | 438/396 |
| 2006/0234443 A1* | 10/2006 | Yang et al. .......... | 438/253 |

FOREIGN PATENT DOCUMENTS

KR    1020050031214 A    *    6/2005

* cited by examiner

*Primary Examiner*—N Drew Richards
*Assistant Examiner*—Grant S Withers
(74) *Attorney, Agent, or Firm*—McKenna Long & Aldridge, LLP

(57) ABSTRACT

A method for fabricating a metal-insulator-metal (MIM) capacitor of a semiconductor device is provided. The method includes simultaneously patterning a lower metal film pattern and a dielectric film pattern to form a first structure in a MIM capacitor region and a second structure in a metal line region, removing the dielectric film pattern in the metal line region, forming a second insulating film to cover the dielectric film pattern in the MIM capacitor region and the lower metal line film pattern in the metal line region, simultaneously forming a trench that exposes the dielectric film pattern in the MIM capacitor region and a via hole that exposes the lower metal line film pattern in the metal line region by passing through the second insulating film, and forming an upper metal electrode film pattern and a via contact to respectively bury the trench and the via hole.

9 Claims, 7 Drawing Sheets

METHOD FOR FABRICATING METAL-INSULATOR-METAL CAPACITOR OF SEMICONDUCTOR DEVICE WITH REDUCED PATTERNING STEPS

This application claims the benefit of Korean Patent Application No. 10-2004-0113158, filed on Dec. 27, 2004, which is hereby incorporated by reference for all purposes as if fully set forth herein.

BACKGROUND OF THE INVENTION

1. Field of the Invention

The present invention relates to semiconductor devices, and more particularly, to a method for fabricating a metal-insulator-metal (MIM) capacitor of a semiconductor device.

2. Discussion of the Related Art

MIM capacitors exhibit excellent supply voltage (Vcc) and mismatch characteristics and are generally designed to have capacitances of 1 fF/$\mu$m$^2$. There is a trend toward higher capacitance requirements for MIM capacitors in fields such as analog-to-digital converters, switching capacitor filters, mixed signal technology, and radio frequency applications.

FIGS. 1-7 illustrate a related art method for fabricating a MIM capacitor.

As shown in FIG. 1, a lower metal electrode film pattern 120 is formed on a first insulating film 110 on a semiconductor 100. The lower metal electrode film pattern 120 is formed of Al. Next, as shown in FIG. 2, a second insulating film 130 is formed on the insulating film 110 and the lower metal electrode film pattern 120. A trench 131 formed in second insulating film 120 using a predetermined mask film partially exposes a surface of the lower metal electrode film pattern 120. A dielectric film 140 is formed on the second insulating film 130 and the lower metal electrode film pattern 120 exposed by the trench 131. The dielectric film 140 is formed of $SiO_2$, $Si_3N_4$, or $Ta_2O_3$.

As shown in FIG. 3, a via hole 132 formed in the dielectric film 140 and the second insulating film 130 using a predetermined mask film partially exposes the surface of the lower metal electrode film pattern 120. As shown in FIG. 4, a barrier metal film 150 is formed on the entire surface, and an upper metal electrode film 160 is formed on the barrier metal film 150. The barrier metal film 150 is formed of Ti/TiN, and the upper metal electrode film 160 is formed of W.

As shown in FIG. 5, the upper metal electrode film 160, the barrier metal film 150 and the dielectric film 140 are planarized to expose the second insulating film 130, so that an upper metal electrode film pattern 161 and a via contact 162 are formed.

As shown in FIG. 6, a first metal line film 171 and a second metal line film 172 are formed. The first metal line film 171 and the second metal line film 172 are electrically connected with the upper metal electrode film pattern 161 and the via contact 162, respectively.

As shown in FIG. 7, the MIM capacitor is completed, in which the lower metal electrode film pattern 120 is arranged on the first insulating film 110. The trench 131 for the capacitor structure is spaced apart from the via contact 162 for a metal line of the lower metal electrode film pattern 120.

However, in the aforementioned related art method for fabricating a MIM capacitor, the trench 131 serving as the capacitor and the via hole 132 for the metal line of the lower metal electrode film pattern 120 are formed by separate photolithographic processes. In the related art, the process steps are increased. This increases cycle time and reduces an area of the capacitor, thereby deteriorating efficiency.

SUMMARY OF THE INVENTION

Accordingly, the present invention is directed to a method for fabricating a metal-insulator-metal capacitor of a semiconductor device that substantially obviates one or more problems due to limitations and disadvantages of the related art.

An advantage of the present invention is to provide a method for fabricating a MIM capacitor of a semiconductor device in which a capacitor region and a metal line region are formed by one process to reduce the number of process steps and increase an area of the capacitor.

Additional features and advantages of the invention will be set forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the invention, as embodied and broadly described, there is provided a method for fabricating a metal-insulator-metal (MIM) capacitor of a semiconductor device, the method comprising steps of (a) forming a structure in which a lower metal film pattern and a dielectric film pattern are sequentially deposited on a first insulating film on a semiconductor substrate; (b) simultaneously patterning the lower metal film pattern and the dielectric film pattern to form a first structure in a MIM capacitor region, in which a lower metal electrode film pattern and the dielectric film pattern are sequentially deposited, and a second structure in a metal line region, in which a lower metal line film pattern and the dielectric film pattern are sequentially deposited; (c) removing the dielectric film pattern in the metal line region using a wet etching process to expose the lower metal line film pattern; (d) forming a second insulating film to cover the dielectric film pattern in the MIM capacitor region and the lower metal line film pattern in the metal line region; (e) simultaneously forming a trench that exposes the dielectric film pattern in the MIM capacitor region and a via hole that exposes the lower metal line film pattern in the metal line region by passing through the second insulating film; and (f) forming an upper metal electrode film pattern and a via contact to respectively bury the trench and the via hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings. Wherever possible, like reference designations will be used throughout the drawings to refer to the same or like parts.

Figure 1:
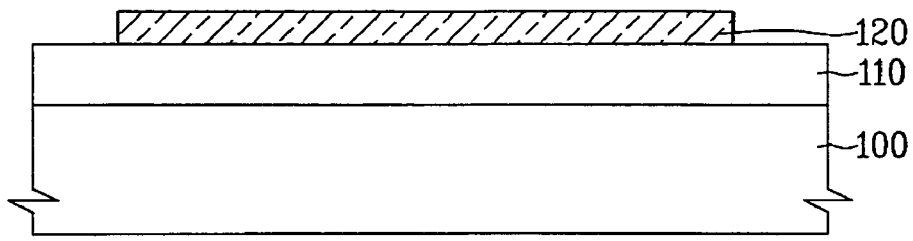
FIGS. 1-7 illustrate a related art method for fabricating a MIM capacitor.
Figure 2:
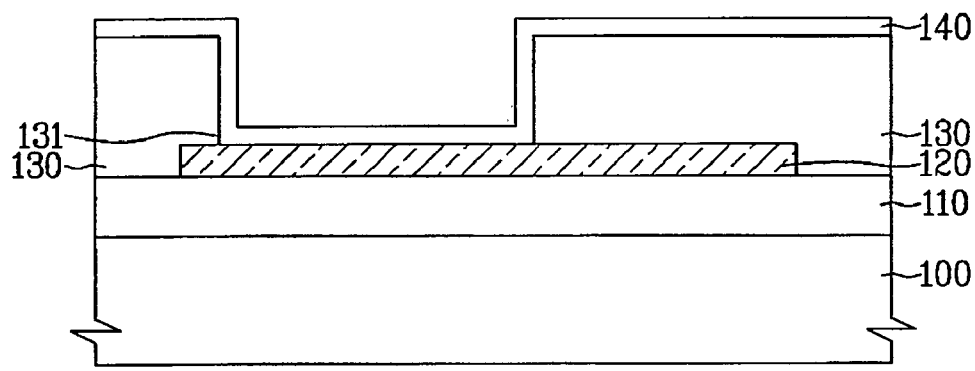
Figure 3:
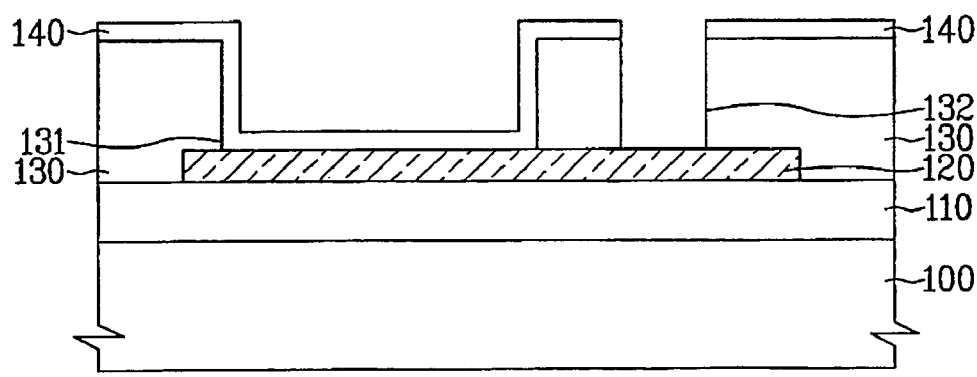
Figure 4:
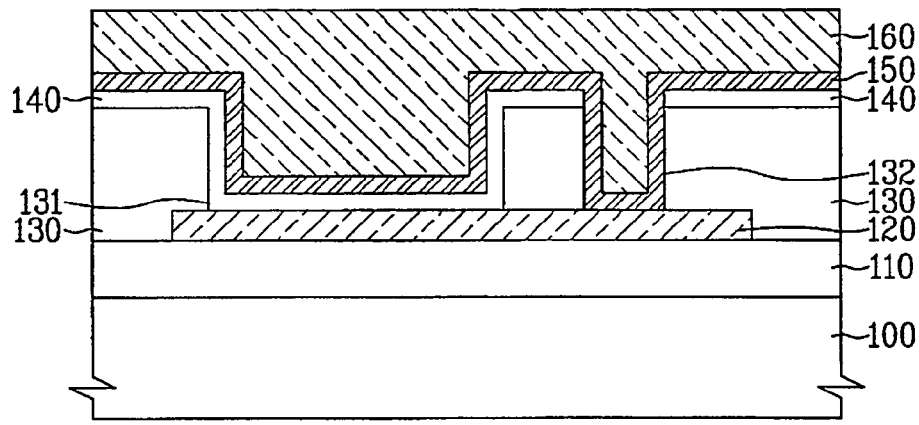
Figure 5:
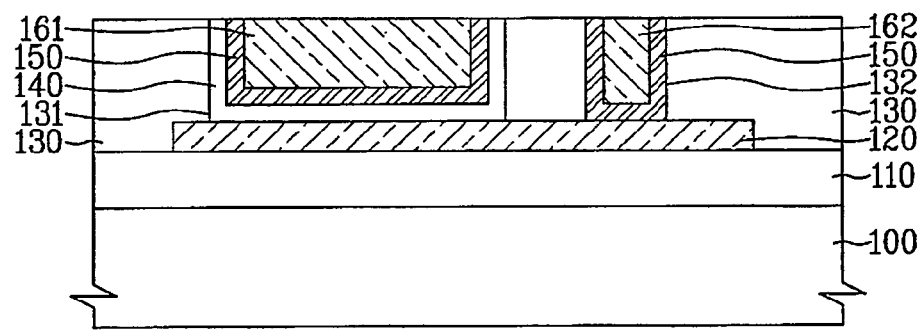
Figure 6:
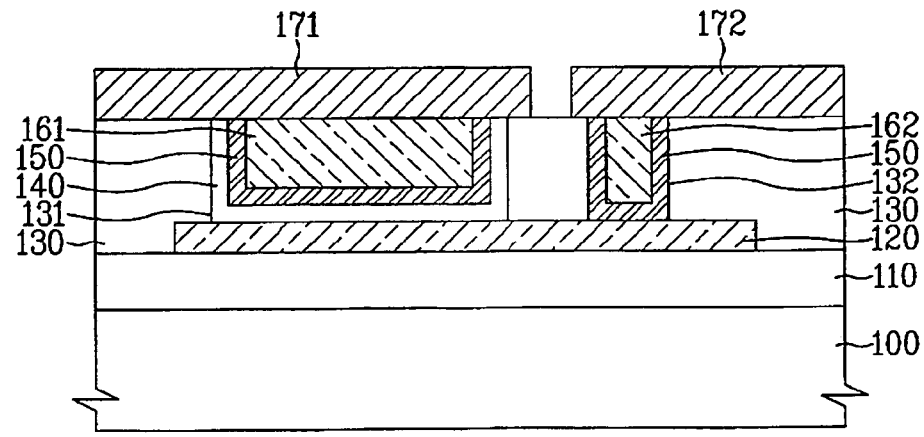
Figure 7:
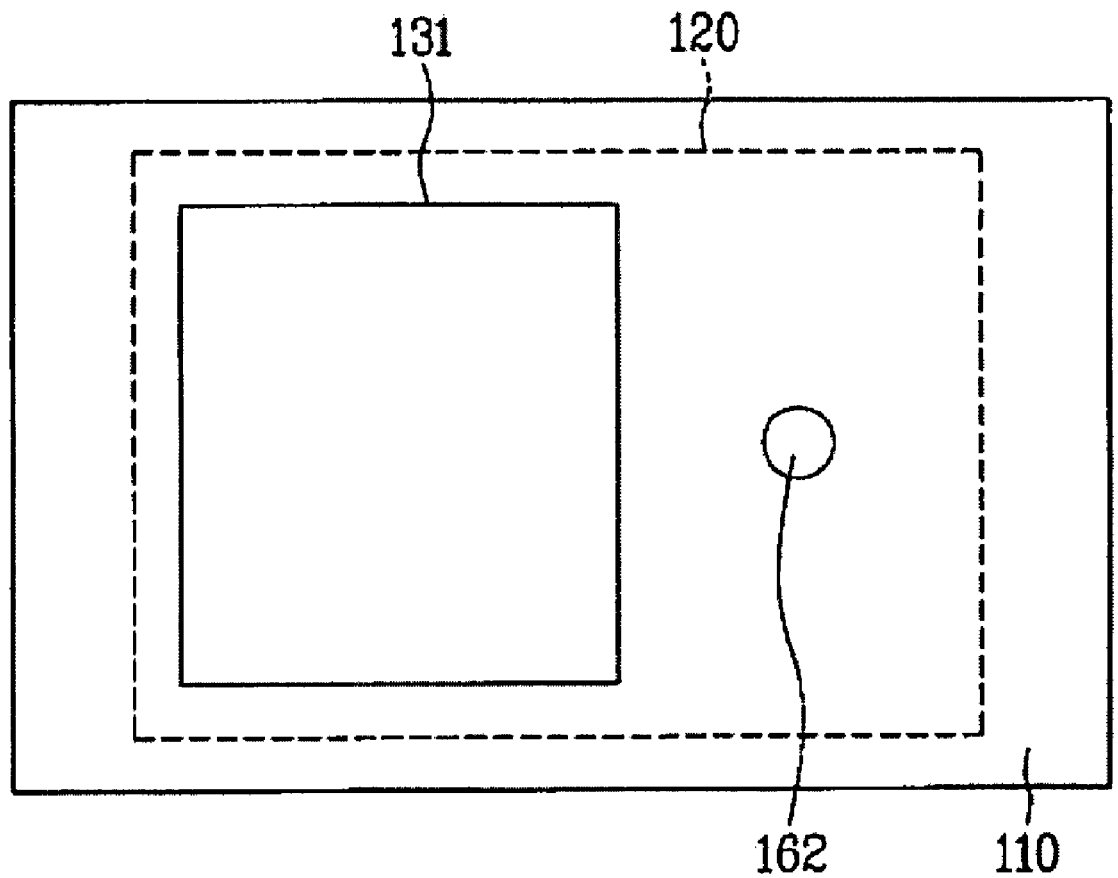
Figure 8:
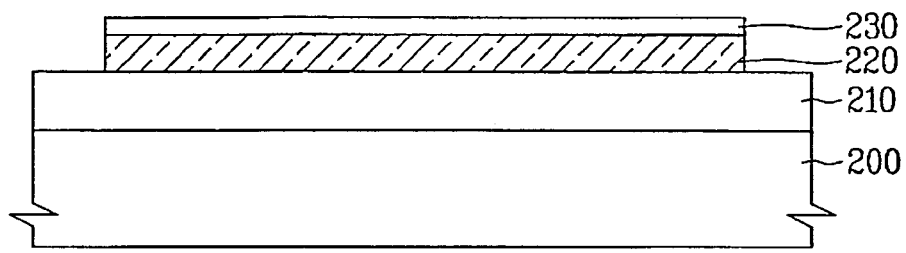
FIGS. 8-16 illustrate a method for fabricating a MIM capacitor according to the present invention.

Referring to FIG. 8, a lower metal film pattern 220 and a dielectric film pattern 230 are sequentially deposited on a first insulating film 210 on a semiconductor substrate 200 such as a silicon substrate. The first insulating film 210 is for electrical insulation and planarization. The first insulating film 210 may be an interlayer dielectric film or an inter-metal dielectric film. The lower metal film pattern 220 has a deposition structure in which a Ti/TiN film is arranged on and below an Al film. For example, the lower metal film pattern 220 has a Ti/TiN/Al/TiN structure, a Ti/TiN/Al/Ti/TiN structure, a Ti/Al/TiN structure, or a Ti/Al/Ti/TiN structure. In either case, the uppermost TiN film is exposed. This TiN film has a thickness of 100 Å to 1000 Å. The dielectric film pattern 230 is used as the dielectric film of the MIM capacitor. The dielectric film pattern 230 is formed of $Si_2O_3$, $Si_3N_4$, or $Ta_2O_3$. If the dielectric film pattern 230 is formed of a nitride film, it has a thickness of 100 Å to 1000 Å.

Figure 9:
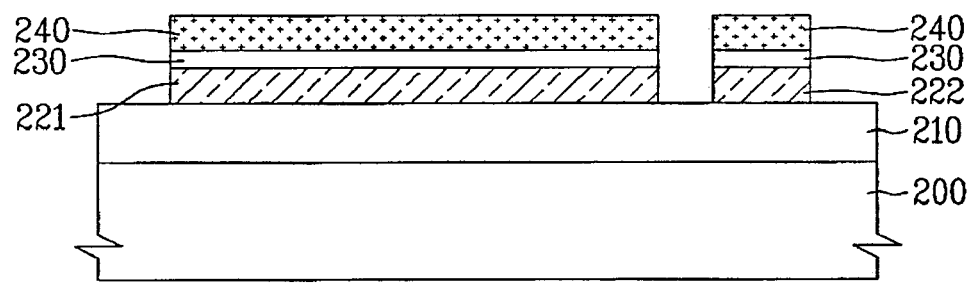

Referring to FIG. 9, a first photoresist film pattern 240 serving as a first mask film pattern is formed on the dielectric film pattern 230. Exposed portions of the dielectric film pattern 230 and the lower metal film pattern 220 are sequentially removed by an etching process using the first photoresist film pattern 240 as an etching mask. Then, as shown, a structure is formed in a MIM capacitor region, in which a lower metal electrode film pattern 221, the dielectric film pattern 230 and the first photoresist film pattern 240 are sequentially deposited. A structure is formed in a metal line region, in which a lower metal line film pattern 222, the dielectric film pattern 230 and the first photoresist film pattern 240 are sequentially deposited.

Figure 10:
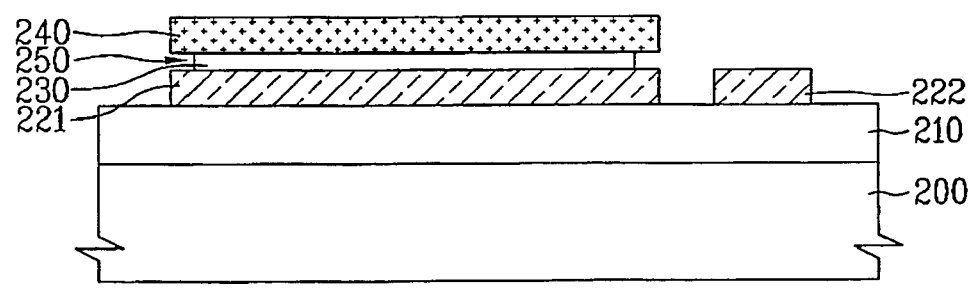

Referring to FIG. 10, the first photoresist film pattern 240 and the dielectric film pattern 230 in the metal line region are removed to expose the lower metal line film pattern 222. To achieve this, the dielectric film pattern 230 undergoes a wet etching process to form structure 250. Then, the dielectric film pattern 230 on the lower metal line film pattern 222 is removed. The first photoresist film pattern 240 on the dielectric film pattern 230 is also removed by a lift off process. The dielectric film pattern 230 existing in the MIM capacitor region is also removed by the wet etching process. However, the lower metal electrode film pattern 221 in the MIM capacitor region has a width greater than that of the lower metal line film pattern 222 in the metal line region. For example, the lower metal line film pattern 222 has a width of 0.3 μm or less, and the lower metal electrode film pattern 221 has a width of several tens of μm. Therefore, a part of the dielectric film pattern 230 in the MIM capacitor region, especially both ends of the dielectric film pattern 230 are removed in a recess formed by the wet etching process. If the dielectric film pattern 230 is formed of a nitride film, the wet etching process is performed using a wet etching solution such as $H_3PO_4$ at a temperature between 150° C. and 200° C.

Figure 11:
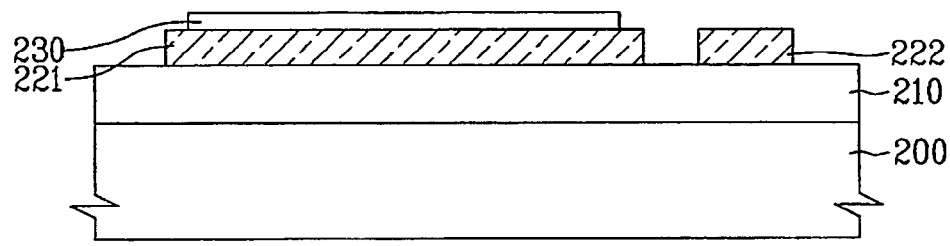

Referring to FIG. 11, the first photoresist film pattern 240 remaining in the MIM capacitor region is removed by typical ashing and stripping processes. Then, a structure is formed in the MIM capacitor region, in which the lower metal electrode film pattern 221 and the dielectric film pattern 230 are sequentially deposited. A structure is formed in the metal line region, in which the lower metal line film pattern 222 is only deposited.

Figure 12:
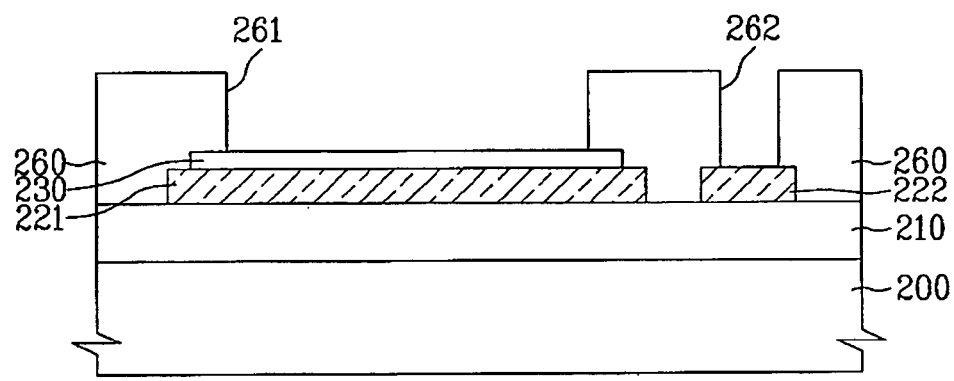

Referring to FIG. 12, a second insulating film 260 is formed on the entire surface, and a second predetermined mask film pattern, for example, a second photoresist film pattern (not shown) is formed on the second insulating film 260. The second photoresist film pattern has a first opening and a second opening. The first opening exposes a first surface of the second insulating film 260 in which a trench of the MIM capacitor region is to be formed. The second opening exposes a second surface of the second insulating film 260 in which a via hole of the metal line region is to be formed. Exposed portions of the second insulating film 260 exposed in the MIM capacitor region and the metal line region are removed by an etching process using the second photoresist film pattern as an etching mask. Thus, a trench 261 in the MIM capacitor region is formed in the second insulating film 260 to expose the dielectric film pattern 230. A via hole 262 in the metal line region is formed in the second insulating film 260 to expose the lower metal line film pattern 222.

Figure 13:
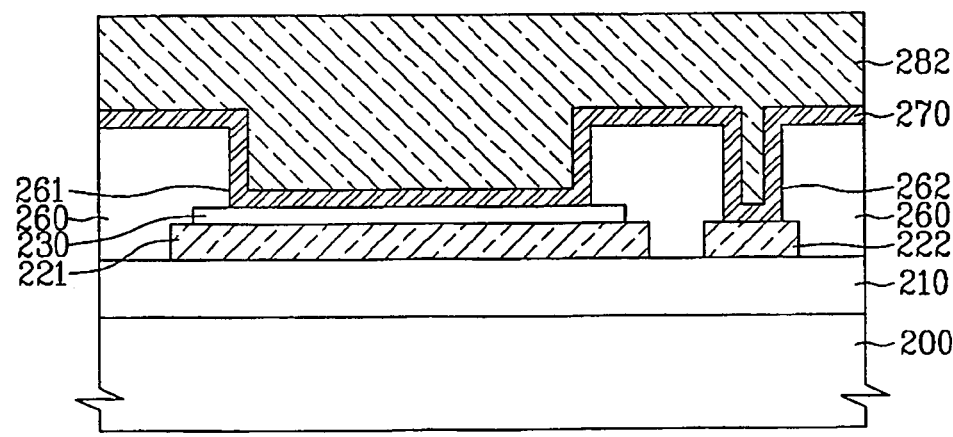

Referring to FIG. 13, a barrier metal film 270 is formed on the entire surface including the trench 261 and the via hole 262. An upper metal film 282 is formed on the barrier metal film 270 to bury the trench 261 and the via hole 262. The barrier metal film 270 is formed of a Ti/TiN film having a thickness of 1000 Å or less, and the upper metal film 282 is formed of W.

Figure 14:
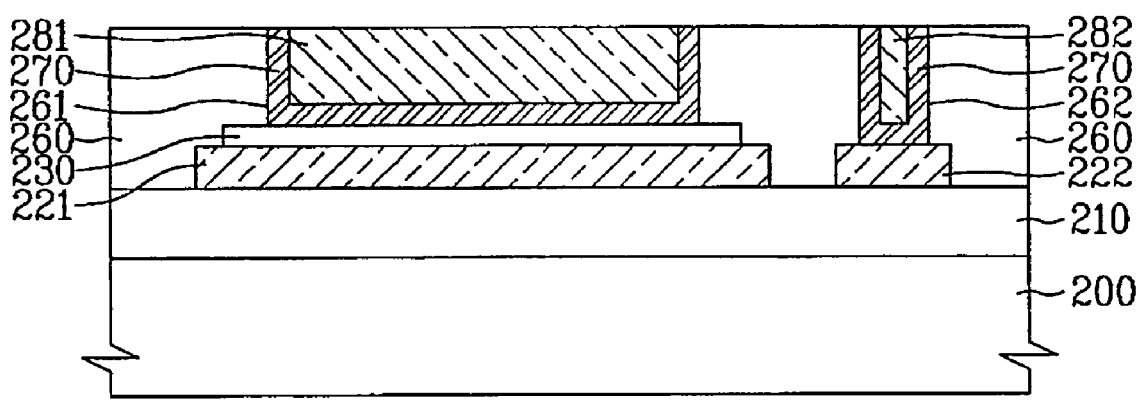

Referring to FIG. 14, the upper metal film 280 and the barrier metal film 270 are planarized by chemical-mechanical polishing to expose the second insulating film 260, so that an upper metal electrode film pattern 281 and a via contact 282 are formed in the MIM capacitor region, and the metal region, respectively.

Figure 15:
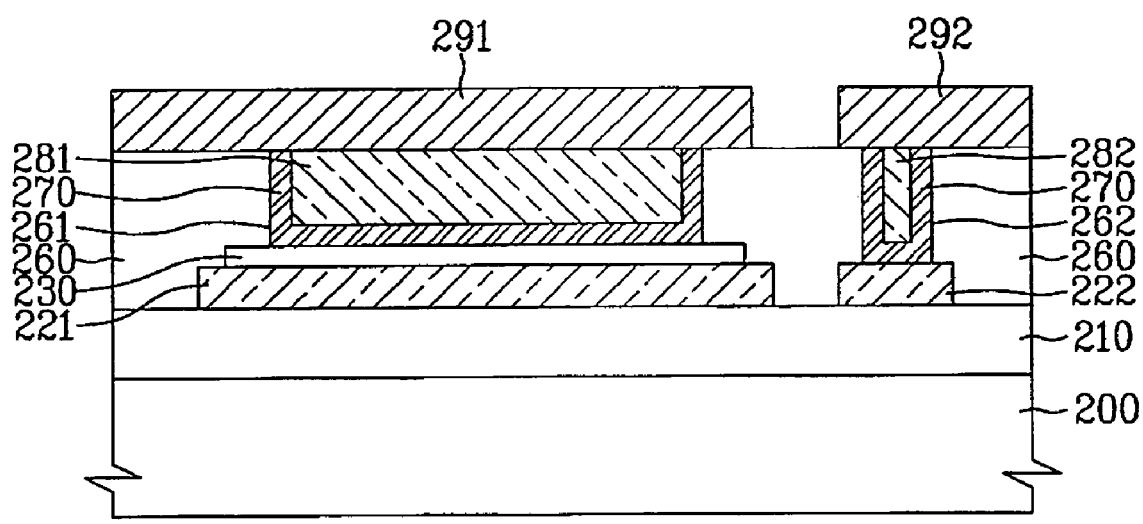

Referring to FIG. 15, a first metal line film 291 and a second metal line film 292 are formed. The first metal line film 291 and the second metal line film 292 are electrically connected with the upper metal electrode film pattern 281 and the via contact 282, respectively.

Figure 16:
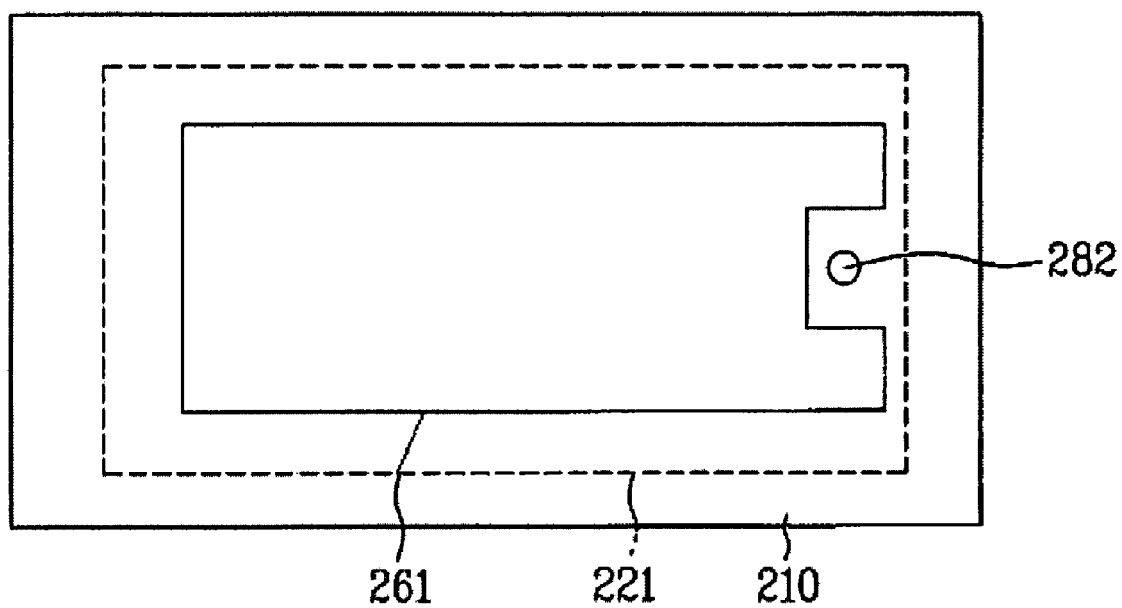

Referring to FIG. 16, the MIM capacitor is completed. The lower metal electrode film pattern 221 is arranged on the first insulating film 210 and the trench 261 for the capacitor structure and the via hole 262 for the metal line are formed by a single process.

Since the trench in the capacitor region and the via hole in the metal line region are simultaneously formed, it is possible to reduce the number of process steps and increase an area of the MIM capacitor. As a result, the MIM capacitor having high efficiency can be fabricated.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a metal-insulator-metal (MIM) capacitor of a semiconductor device, comprising steps of:
   (a) forming a structure in which a lower metal film pattern and a dielectric film pattern are sequentially deposited on a first insulating film on a semiconductor substrate;
   (b) simultaneously patterning the lower metal film pattern and the dielectric film pattern to form a first structure in a MIM capacitor region, in which a lower metal electrode film pattern and the dielectric film pattern are sequentially deposited on the first insulating film, and a second structure in a metal line region, in which a lower metal line film pattern and the dielectric film pattern are sequentially deposited on the first insulating film, wherein the lower metal electrode film pattern and the lower metal line film pattern are in direct contact with and formed on top of the first insulating film;

(c) removing the dielectric film pattern in the metal line region using a wet etching process to expose the lower metal line film pattern;

(d) forming a second insulating film to cover the dielectric film pattern in the MIM capacitor region and the lower metal line film pattern in the metal line region;

(e) simultaneously forming a trench that exposes the dielectric film pattern in the MIM capacitor region and a via hole that exposes the lower metal line film pattern in the metal line region by passing through the second insulating film; and (f) forming an upper metal electrode film pattern and a via contact to respectively bury the trench and the via hole.

2. The method of claim 1, wherein step (b) comprises:
forming a mask film pattern on the dielectric film pattern to expose the dielectric film pattern between the MIM capacitor region and the metal line region; and
sequentially removing the dielectric film pattern exposed by the mask film pattern and the lower metal film pattern through an etching process using the mask film pattern as an etching mask.

3. The method of claim 2, wherein step (c) comprises:
removing the dielectric film pattern in the metal line region by performing an etching process in the dielectric film pattern; and lifting off the mask film pattern on the removed dielectric film pattern.

4. The method of claim 3, further comprising the step of removing the mask film pattern remaining in the MIM capacitor region.

5. The method of claim 3, wherein the etching process is a wet etching process.

6. The method of claim 1, wherein step (e) comprises:
forming a mask film pattern on the second insulating film, the mask film pattern having openings that expose surfaces of the second insulating film, in which the trench and the via hole are to be formed;
simultaneously forming the trench that exposes the dielectric film pattern in the MIM capacitor region and the via hole that exposes the lower metal line film pattern in the metal line region by performing the etching process in the exposed surfaces of the second insulating film using the mask film pattern as an etching mask; and
removing the mask film pattern.

7. The method of claim 1, wherein the lower metal film pattern is formed of one of a Ti/TiN/Al/TiN film, a Ti/TiN/Al/Ti/TiN film, a Ti/Al/TiN film, and a Ti/Al/Ti/TiN film.

8. The method of claim 7, wherein the uppermost TiN film has a thickness of 100 Å to 1000 Å.

9. The method of claim 1, wherein the dielectric film pattern is formed of one of $Si_2O_3$, $Si_3N_4$ and $Ta_2O_3$ at a thickness of not more than 1000 Å.

* * * * *